United States Patent
Chiu et al.

(10) Patent No.: US 8,912,959 B2
(45) Date of Patent: Dec. 16, 2014

(54) PACKAGING STRUCTURE AND METHOD OF FABRICATING THE SAME

(75) Inventors: Chih-Hsien Chiu, Taichung (TW); Tsung-Hsien Tsai, Taichung (TW); Chao-Ya Yang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 203 days.

(21) Appl. No.: 13/566,296

(22) Filed: Aug. 3, 2012

(65) Prior Publication Data
US 2013/0093629 A1 Apr. 18, 2013

(30) Foreign Application Priority Data
Oct. 17, 2011 (TW) .............................. 100137484 A

(51) Int. Cl.
| | |
|---|---|
| *H01Q 1/38* | (2006.01) |
| *H01Q 1/24* | (2006.01) |
| *H01Q 1/52* | (2006.01) |
| *H01L 23/552* | (2006.01) |
| *H01Q 1/36* | (2006.01) |
| *H01L 23/66* | (2006.01) |
| *H01L 23/31* | (2006.01) |

(52) U.S. Cl.
CPC ....... *H01L 23/552* (2013.01); *H01L 2223/6677* (2013.01); *H01Q 1/243* (2013.01); *H01Q 1/38* (2013.01); *H01L 23/3121* (2013.01); *H01Q 1/521* (2013.01); *H01L 2224/32225* (2013.01); *H01Q 1/52* (2013.01); *H01L 2224/73265* (2013.01); *H01L 2224/48227* (2013.01); *H01Q 1/36* (2013.01); *H01L 23/66* (2013.01); *H01L 2224/16225* (2013.01)
USPC ..................... 343/700 MS; 343/702; 343/841

(58) Field of Classification Search
USPC ........... 343/700 MS, 841, 702; 257/659, 687, 257/690
See application file for complete search history.

(56) References Cited

U.S. PATENT DOCUMENTS

| | | | | |
|---|---|---|---|---|
| 6,867,746 | B2 * | 3/2005 | Mendolia et al. | 343/841 |
| 7,049,682 | B1 | 5/2006 | Mathews et al. | |
| 7,724,193 | B2 * | 5/2010 | Soora et al. | 343/700 MS |
| 2012/0092220 | A1 * | 4/2012 | Tani et al. | 343/702 |
| 2013/0015563 | A1 * | 1/2013 | Lee et al. | 257/659 |

* cited by examiner

*Primary Examiner* — Hoang V Nguyen
(74) *Attorney, Agent, or Firm* — Edwards Wildman Palmer LLP; Peter F. Corless; Steven M. Jensen

(57) ABSTRACT

A packaging structure and a method of fabricating the same are provided. The packaging structure includes a substrate, first packaging element disposed on the substrate, a second packaging element disposed on the substrate and spaced apart from the first packaging element, a first antenna disposed on the first packaging element, and a metal layer formed on the second packaging element. The installation of the metal layer and the antenna enhances the electromagnetic shielding effect.

22 Claims, 4 Drawing Sheets

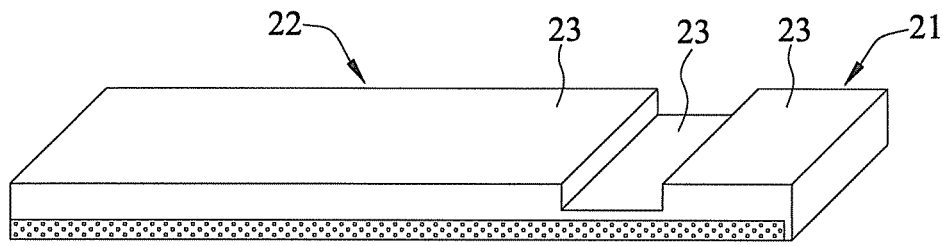
FIG.2A
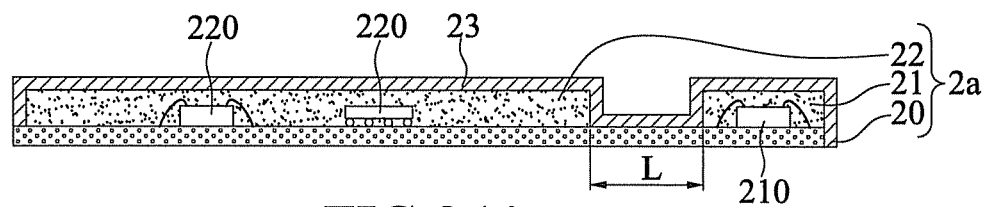
FIG.2A'
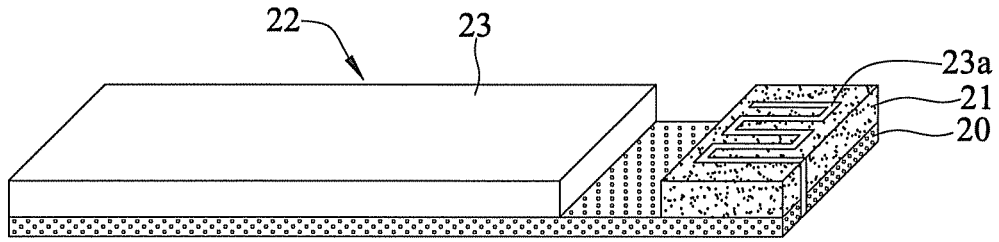
FIG.2B
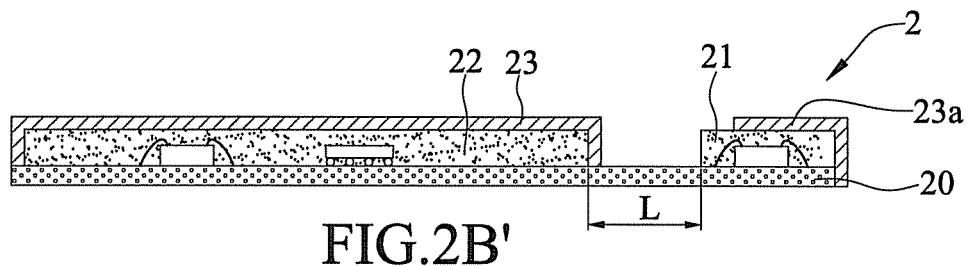
FIG.2B'
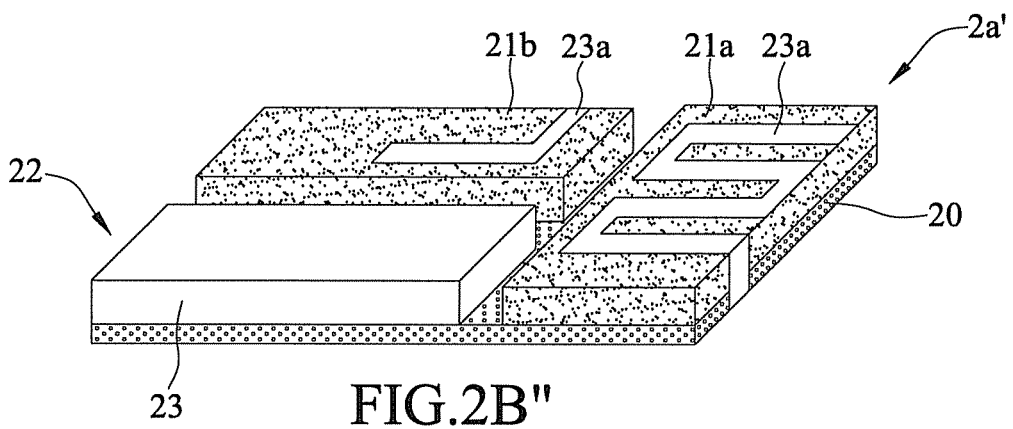
FIG.2B"

FIG.3A"

PACKAGING STRUCTURE AND METHOD OF FABRICATING THE SAME

CROSS-REFERENCES TO RELATED APPLICATIONS

This application claims under 35 U.S.C. §119(a) the benefit of Taiwanese Application No. 100137484, filed Oct. 17, 2011, the entire contents of which is incorporated herein by reference.

BACKGROUND OF THE INVENTION

1. Field of the Invention

The present invention relates to packaging substrates and methods of fabricating the same, and, more particularly, to a packaging substrate having an antenna and a method of fabricating the packaging substrate.

2. Description of Related Art

Along with the trends of low profile and compact size, a system in package (SiP) comes to the market. The SiP integrates various electronic elements, such as one or more chips, passive components, antennas, into the same package. If electromagnetic element working in high frequency, such as radio frequency (RF) element and antenna, are integrated into a high frequency device, the high-frequency device will interfere the operation of neighboring electronic element. To meet the high integration requirement, electronic elements in the package are disposed closer and closer, which worsens the interference problem.

Thus, electromagnetic interference becomes one of the major issues in designing a wireless communication module and an antenna, such as a global system for mobile communication (GSM), a wireless LAN (WLAN), a global positioning system (GPS), a Bluetooth apparatus, and a digital video broadcasting-handheld (DVB-H) apparatus. The wireless modules and antennas are integrated in a limited area, and the noise generated by the devices will affect each other. Thus, the design of integrating the high frequency modules and shielding the other devices from noises are the important factors in packing design.

U.S. Pat. No. 7,049,682 discloses a packing structure with integral shield and antenna. Referring to FIGS. 1A and 1B, a method of fabricating a packaging structure according to the prior art.

As shown in FIG. 1A, a package 1a and a cover 1b are provided. The package 1a has a substrate 10 and a plurality of packaging elements 11 and 12 separated from each other at a predetermined interval on the substrate 10. The packaging elements 11 and 12 have electronic elements 110 and 120, respectively, that are electrically connected to the substrate 10. The cover 1b has a dielectric covering element 14, shields 13 disposed on an internal surface of the dielectric covering element 14 and corresponding to the packaging elements 11 and 12, and an antenna 16 disposed on an external surface of the dielectric covering element 14.

As shown in FIG. 1B, an adhesive material 15 adheres the cover 1b to the substrate 10, such that the shields 13 cover the packaging elements 11 and 12 from electromagnetic interference.

In the packaging structure according to the prior art, the cover 1b that is integrated with a shield structure (e.g., the shield 13) and the antenna 16 is adhered to the package 1a, in order to eliminate the electromagnetic interference.

However, in the cover 1b of the packaging structure according to the prior art, the shields 13 have to correspond in position to the packaging elements 11 and 12. Therefore, the cover 1b shall be re-designed if it is used to cover the packaging elements 11 and 12 that have different layout or to cover more than two packaging elements.

Moreover, gaps, such as an upper space h and a peripheral space w, as shown in FIG. 1B, exist between the shield 13 and the packaging elements 11 and 12. Accordingly, the substrate 10 has to have an increased size and the packaging structure has an increased height, resulting in an adverse effect to the requirements of low profile and compact size.

In addition, the cover 1b has too thick a dielectric cover 14, which is also against the miniaturization of the packaging structure.

Therefore, how to overcome the problems of the prior art becomes a critical topic.

SUMMARY OF THE INVENTION

The present invention discloses a shielding packaging structure, the present invention provides a packaging structure, comprising a substrate, first packaging element disposed on the substrate, a second packaging element disposed on the substrate and spaced apart from the first packaging element, a first antenna disposed on the first packaging element, and a metal layer formed on the second packaging element.

The present invention also provides a method of fabricating a packaging structure, comprising providing a package having a substrate, a first packaging element disposed on the substrate and a second packaging element disposed on the substrate and spaced apart from the first packaging element, forming a metal layer on the first packaging element and the second packaging element, and patterning a first portion of the metal layer that is formed on the first packaging element to form a first antenna on the first packaging element.

In an embodiment, an encapsulant is further formed on the first packaging element and encapsulates the first antenna; at least a conductive hole is formed in the encapsulant and connected to the first antenna; and a second antenna is formed on the encapsulant and connected to the conductive hole.

The present invention further provides a packaging structure, comprising: a substrate, a first packaging element disposed on the substrate, a second packaging element disposed on the substrate and spaced apart from the first packaging element, a metal layer formed on the first packaging element and the second packaging element, an encapsulant formed on a first portion of the metal layer that is formed on the first packaging element, at least a conductive hole formed in the encapsulant and having an end exposed from the encapsulant, and an antenna disposed on the encapsulant and connected to the end of the conductive hole.

The present invention further provides a method of fabricating a packaging structure, comprising: providing a package having a substrate, a first packaging element disposed on the substrate and a second packaging element disposed on the substrate and spaced apart from the first packaging element, forming a metal layer on the first packaging element and the second packaging element, forming an encapsulant on a first portion of the metal layer that is formed on the first packaging element, forming in the encapsulant at least a conductive hole that has a first end connected to the first portion of the metal layer and a second end exposed from the encapsulant, and disposing on the encapsulant an antenna that is connected to the second end of the conductive hole.

In an embodiment, the substrate is a lead frame, a flexible circuit board or a printed circuit board, and the first packaging element or the second packaging element has an electronic element.

In an embodiment, the metal layer is formed by a sputtering process, and the antenna is formed by a laser engraving process.

In an embodiment, the encapsulant is further formed on a second portion of the metal layer that is formed on the second packaging element, and at least a second conductive hole is formed in the encapsulant.

From the above, it is known that a clad structure (e.g., the metal layer and the encapsulant) is formed layer by layer on the fist and second packaging elements. Thus, a process of forming the clad structure needs no modification even if the first and second packaging elements have different layout or a second packaging element is further disposed on the substrate.

Since the metal layer is formed on the first and the second packaging elements, so no gap will exist between the metal layer and the first and second packaging elements. Compared to the prior art, the present invention provides a packaging structure that has a reduced size and a lowered profile.

Compared with the prior art, the present invention provides a packaging structure that does not include a cover.

DETAILED DESCRIPTION OF PREFERRED EMBODIMENTS

Figure 1A:
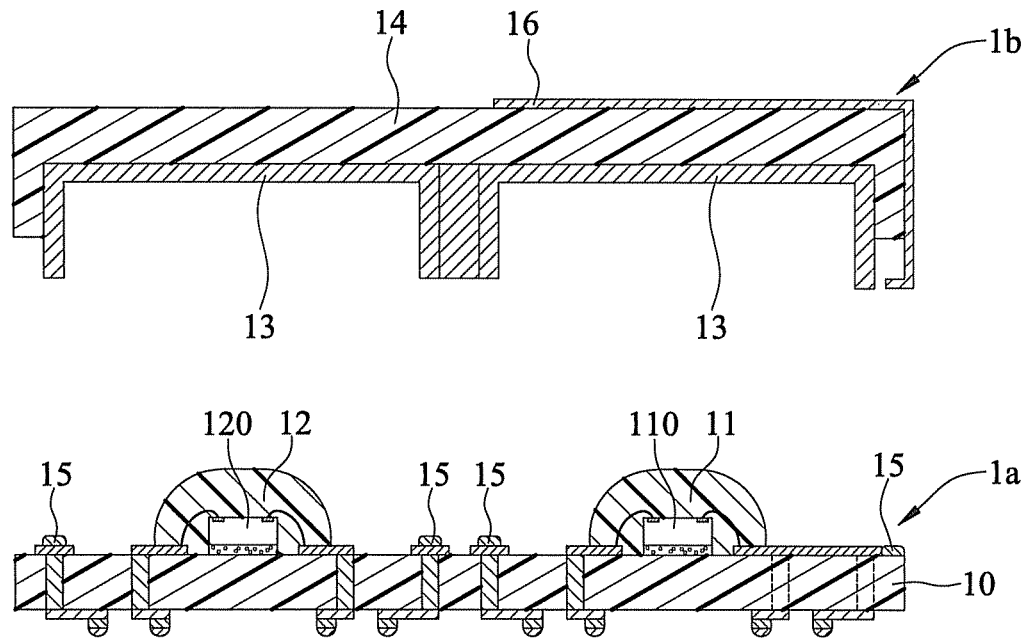
FIGS. 1A and 1B are cross-sectional views illustrating a method of fabricating a packaging structure according to the prior art.
Figure 1B:
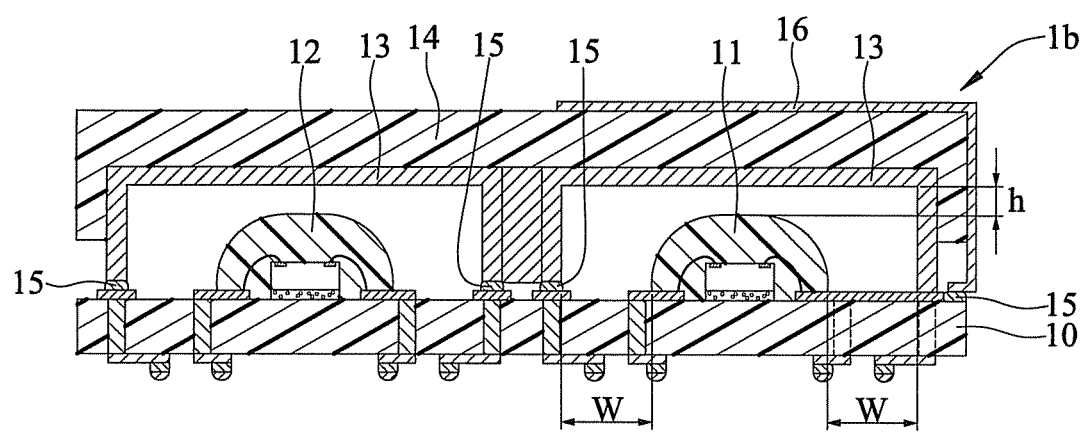

The following illustrates the method of implementation of the present invention by specific embodiments. Whoever has ordinary knowledge in the technical field of the present invention can easily understand the advantages and efficacy of the present invention by the content disclosed in the specification.

Notice that the illustrated structure, ratio and size of appended figures in the specification are only used for the disclosed embodiments in the specification for understanding and reading of those who have ordinary knowledge of this technical field. It is not applicable for limiting implementing condition of the disclosed embodiments, so the illustration does not have actual technical meaning. Any modification of structure, change of ratio and adjustment of size should fall in the disclosed embodiments when the efficacy and purpose of the disclosed embodiments are not affected. Meanwhile, the terms that are quoted in the specification like "upper," "lower,", "bottom," , "side", "three", "a" and so on only intend for convenience of description rather than limiting feasible scope of the disclosed embodiments. Change or adjustment of relative relationship under no actual alteration of technical content should be seen as feasible scope of the disclosed embodiments.

Referring to FIGS. 2A to 2E, schematic diagrams illustrating a method of fabricating a packaging structure of a first embodiment according to the present invention are provided.

As shown in FIGS. 2A and 2A', a package 2a is provided. The package 2a has a substrate 20, a first packaging element 21 and a second packaging element 22 disposed on the substrate 20 and separated from each other at a predetermined interval L. In an embodiment, after a system-in-package (SiP) module is fabricated by a packaging process, laser is emitted onto the SiP module to form a slot (i.e., the interval L), and the SiP module is separated into the first packaging element 21 and the second packaging element 22. In an embodiment, the slot is formed by cutting, grinding, etching processes.

A metal layer 23 is formed on and covers the substrate 20, the first packaging element 21 and the second packaging element. The metal layer 23 may be formed by sputtering, chemical electroplating or electroless plating processes. In an embodiment, the SiP module may have its outer surface plated with metal by controlling an aspect ratio of the interval L, in order to provide a well enough electromagnetic shielding effect.

In an embodiment, the substrate 20 is a lead frame, a flexible circuit board or a printed circuit board. The first packaging element 21 and the second packaging element 22 have electronic elements 210 and 220 electrically connected to the substrate 20, and the metal layer 23 is made of copper. The electronic elements 210 and 220 may include a chip.

As shown in FIGS. 2B and 2B', a patterning process is conducted on the metal layer 23 formed on the first packaging element 21 to form a first antenna 23a disposed on the first packaging element 21 and extending to a lateral surface of the substrate 20 and connected to the pins of the substrate 20 (not shown). The patterning process is conducted by laser engraving or etching. The metal layer 23 formed on the substrate is removed or preserved optionally.

In another embodiment, the metal layer 23 and the first antenna 23a may be formed by covering the first packaging element 21 and the second packaging element 22 with a patterned mold or mask while forming the first antenna 23a on the first packaging element 21 and the metal layer 23 on the second packaging element 22.

The metal layer 23 and the first antenna 23a can be formed by sputtering, chemical electroplating, electroless plating or printing processes.

In an embodiment, the package 2a may include any number of the first packaging element 21 and the second packaging element 22. As shown in FIG. 2B", the package 2a' has two first packaging element 21a and 21b.

The present invention provides a packaging structure that has a first antenna 23a formed by a patterning process. The packaging structure further has the metal layer 23 that prevents the first packaging element 21 and the second packaging element 22 from electromagnetically interfering the first antenna 23a, and vice versa.

Figure 2C:
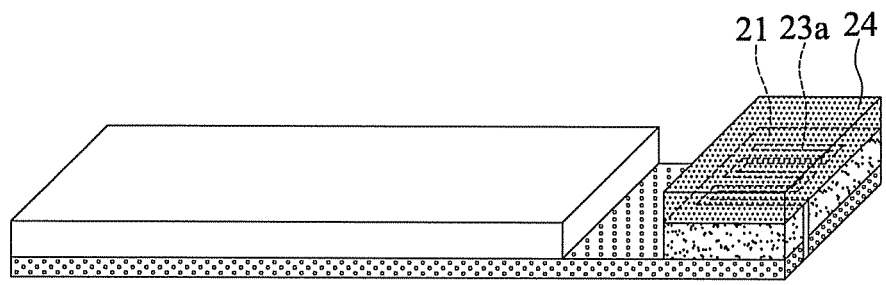
FIGS. 2A, 2A', 2B, 2B', 2B", 2C, 2D, 2E and 2E' are schematic diagrams illustrating a method of fabricating a packaging structure of a first embodiment according to the present invention, wherein FIGS. 2A' and 2B' are cross-sectional views of FIGS. 2A and 2B, and FIGS. 2B" and 2E" correspond to FIGS. 2B and 2E, respectively.
Figure 2D:
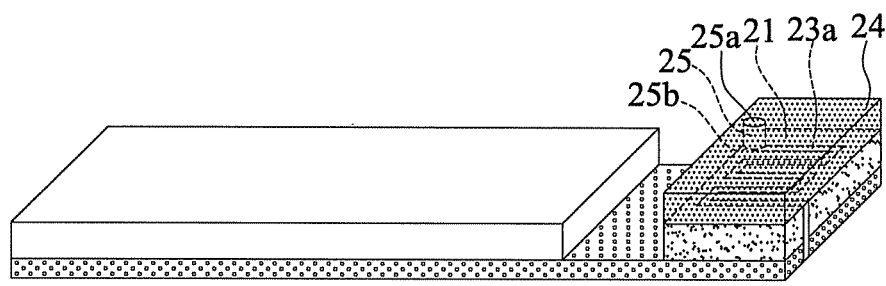
Figure 2E:
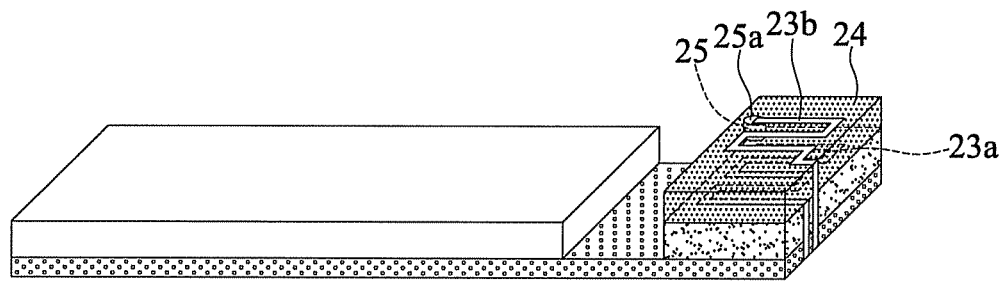
Figure 2E:
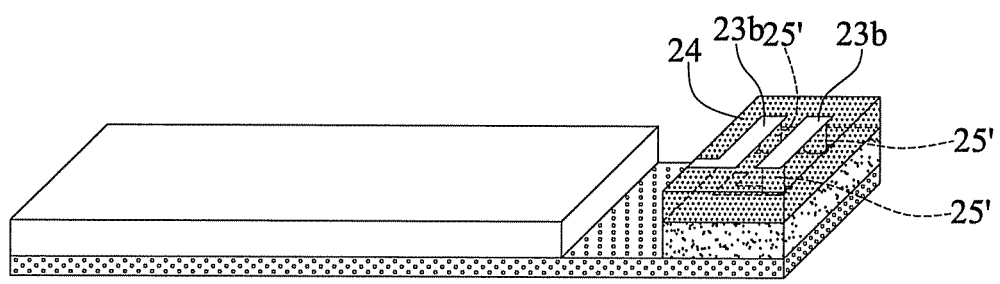

Referring to FIGS. 2C to 2E, schematic views illustrating a method of fabricating a packaging structure in subsequent processes of the first embodiment according to the present invention.

As shown in FIG. 2C, an encapsulant 24 is formed on the first packaging element 21 to cover the first antenna 23a.

As shown in FIG. 2D, a through hole is formed by a laser engraving process, and is plated with and covered by a conductive material to form in the encapsulant 24a conductive hole 25 electrically connected to the first antenna 23a.

In an embodiment, the conductive hole 25 has an upper end 25a and a lower end 25b connected to the first antenna 23a. In addition to the plating process, the conductive hole 25 may be formed by filling the through hole with a conductive glue.

As shown in FIG. 2E, a second antenna 23b is formed on the encapsulant 24 and connected to the upper end 25a of the conductive hole 25. In an embodiment, the second antenna 23b is a conductive trace and is made by: forming a metal material such as copper on the encapsulant 24, a lateral surface of the first packaging element 21, and a lateral surface of the substrate 20, and conducting the patterning process by laser engraving or etching. Therefore, the second antenna 23b extends to the lateral surfaces of the first packaging element 21 and the substrate 20. The second antenna 23b can also be formed by an electroplating process.

As shown in FIG. 2E', the first antenna 23a and the second antenna 23b are not necessary to be extended to the lateral surfaces of the first packaging element 21 and the substrate 20.

In another embodiment, the second antenna 23b can be made by covering the encapsulant 24 with a patterned mold or mask, and forming the second antenna 23b that covers on the encapsulant 24.

A metal material used in the formation of the second antenna 23b can be formed by sputtering, chemical electroplating, electroless plating or printing processes.

Through the formation of the conductive hole 25, the first antenna 23a is connected to the second antenna 23b through the conductive hole 25. That is, the metal layer 23 is designed with integrated antenna, including omni-directional antenna and directional antenna on the SiP module for improving the flexibility of wiring and providing a well enough electromagnetic shielding effect.

The packaging structure may include any number of conductive holes 25'. For instance, three conductive holes 25' are shown in FIG. 2E'. The greater the number of the conductive holes 25' is, the more the antennas that are formed on the first packaging element 21 become. Accordingly, the first packaging element 21 can receive and transmit different signals to meet the need of multi-function.

In an embodiment, the metal layer 23 and the encapsulant 24 are sequentially formed on the package 2a. When the user needs to adjust the positions (or layout) of the first packaging element 21 and the second packaging element 22 or add other integrated elements, the metal layer 23 and the encapsulant 24 are formed by the original process without any modification, convenient for altering the design, while the flexibility of the design is enhanced and the cost of manufacture is lowered.

Moreover, the cover according to the prior art is not necessary in the present invention, so it is beneficial for miniaturization of the product.

The present invention provides a packaging structure 2 including a package 2a, a first antenna 23a and a metal layer 23.

The package 2a has a substrate 20, a first packaging element 21 and a second packaging element 22 disposed on the substrate 20 and separated from each other at a predetermined interval. In an embodiment, the substrate 20 is a lead frame, a flexible circuit board or a printed circuit board, and the first packaging element 21 and the second packaging element 22 have electronic elements 210 and 220.

The first antenna 23a is formed on the first packaging element 21.

The metal layer is formed on the second packaging element 22.

The packaging structure 2 further includes an encapsulant 24, a conductive hole 25 and a second antenna 23b.

The encapsulant 24 is formed on the first packaging element 21 and covers the first antenna 23a.

The conductive holes 25 and 25' are formed in the encapsulant 24 and connected to the first antenna 23a and the second antenna 23b. The number of the conductive holes 25 and 25' is not limited to two.

The second antenna 23b is disposed on the encapsulant 24. The first antenna 23a and the second antenna 23b can be designed to be omni-directional or multi-directional.

Figure 3A:
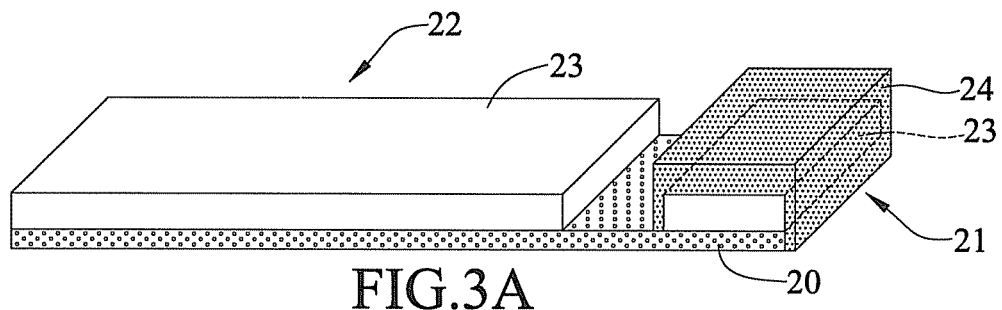
FIGS. 3A, 3A', 3A", 3B and 3C are schematic diagrams illustrating a method of fabricating a packaging structure of a second embodiment according to the present invention, wherein FIG. 3A' is a cross-sectional view of FIG. 3A, and FIG. 3A" shows another embodiment of FIG. 3A.
Figure 3A:
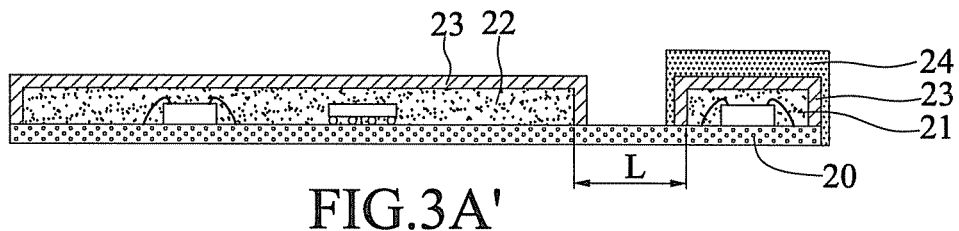
Figure 3B:
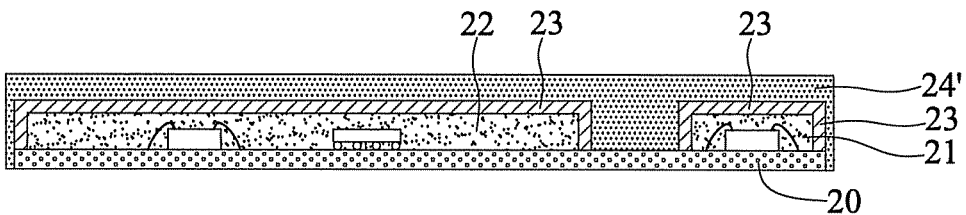
Figure 3B:
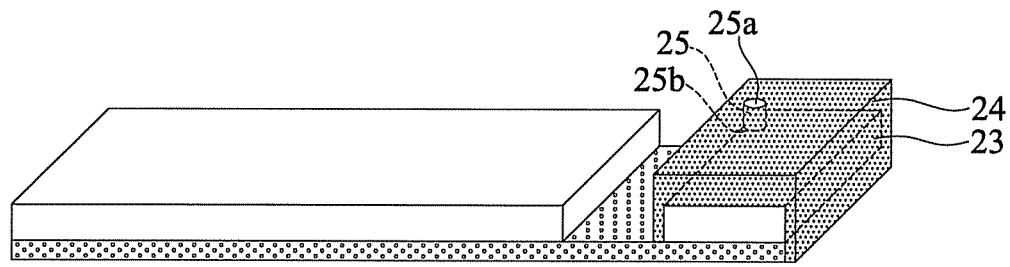
Figure 3C:
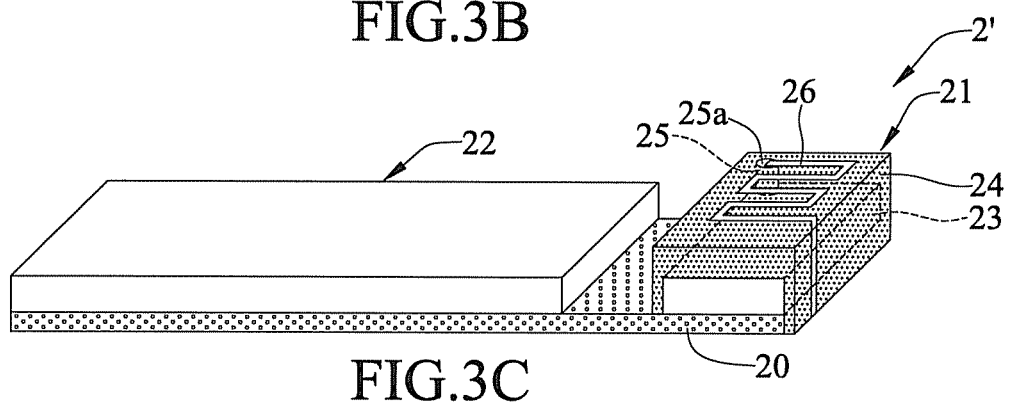

Referring to FIGS. 3A to 3C, schematic views illustrating a method of fabricating a packaging structure of a second embodiment according to the present invention are provided. The second embodiment differs from the first embodiment in that an antenna in the second embodiment is not formed on the first packaging element 21.

As shown in FIGS. 3A and 3A', continuing the process of FIG. 2A, the metal layer 23 formed on the substrate 20 can be removed or preserved optionally. In an embodiment, the metal layer 23 formed on the substrate 20 is removed before the encapsulant 24 is formed on the metal layer 23 of the first packaging element 21 and the lateral surface of the substrate 20.

In another embodiment, as shown in FIG. 3A", the encapsulant 24' can be formed on the entire metal layer 23. That is, the first packaging element 21 and the second packaging element 22 are formed on the metal layer 23.

As shown in FIG. 3B, continuing the process of FIG. 3A and referring to the process of FIG. 2D, the conductive hole 25 is formed in the encapsulant 24. The conductive hole 25 has a lower end 25b connected to the metal layer 23 formed on the first packaging element 21.

As shown in FIG. 3C, an antenna 26 is formed on the encapsulant 24 and connected to the upper end 25a according to the process of FIG. 2E. The antenna 26 extends to the lateral bottom of the encapsulant 24 of the first packaging element 21.

In the second embodiment, the antenna 26 is formed by a patterning process, and is electrically connected to the metal layer 23 through the conductive hole 25. The metal layer 23 protects the first packaging element 21 and the second packaging element 22 from electromagnetic interference. The metal layer 23 can act as a ground plane for the antenna 26.

The metal layer 23 is directly formed on the first packaging element 21 and the second packaging element 22, and gaps do not exist therebetween. Thus, the size of the substrate 20 can be reduced, and the packaging structure has a reduced height.

The metal layer 23 and the encapsulant 24 are sequentially formed on the package 2a. When the user is in need of adjusting the positions (or layout) of the first packaging element 21 and the second packaging element 22 or adding other integrated elements, the metal layer 23 and the encapsulant 24 can be formed by the original process, advantageous in modifying the design, raising designing flexibility and significantly lowering the cost.

Moreover, the method according to the present invention can get rid of the cover of the prior art, thus advantageous in miniaturization of the product.

The present invention further provides a packaging structure 2' including an package 2a, a metal layer 23, an encapsulant 24, a conductive hole 25 and an antenna 26.

The package 2a has a substrate 20, a first packaging element 21 and a second packaging element 22 disposed on the substrate 20 and separated from each other at a predetermined interval L. In an embodiment, the substrate is a lead frame, a flexible circuit board or a printed circuit board, and the first packaging element 21 and the second packaging element 22 have electronic elements 210 and 220.

The metal layer 23 is formed on the first packaging element 21 and the second packaging element 22.

The encapsulant 24 is formed on the metal layer 23 of the first packaging element 21, and the encapsulant 24' can be formed on the metal layer 23 on the second packaging element 23.

The conductive hole(s) 25 is/are formed on the encapsulant 24 and connected to the metal layer 23 on the first packaging element 21.

The antenna 26 is formed on the encapsulant 24 and 24' and connected to the conductive hole 25. The antenna 26 can be designed to be omni-directional or multi-directional.

To sum up, the packaging structure according to the present invention and the method of fabricating the same can integrate the systemic elements, reduce the disturbance between the high-frequency elements and other elements and raise the flexibility of electromagnetic shielding and designing antenna.

The embodiments illustratively explain the theory of the present invention and the efficacy thereof rather than limiting the present invention. Whoever has ordinary knowledge in the technical of the present invention can modify the embodiments without violating the spirit of the present invention and the scope thereof. Thus, the rights protection of the present invention should be listed as the following.

What is claimed is:

1. A packaging structure, comprising:
   a substrate;
   a first packaging element disposed on the substrate;
   a second packaging element disposed on the substrate and spaced apart from the first packaging element;
   a first antenna formed on the first packaging element, wherein the second packaging element is free from being correspondingly formed with an antenna structure thereon; and
   an electromagnetic interference shield metal layer formed on the second packaging element, wherein the first packaging element is free from being correspondingly formed with an electromagnetic interference shield structure thereon.

2. The packaging structure of claim 1, wherein the first packaging element or the second packaging element further comprises at least one electronic element.

3. The packaging structure of claim 1, further comprising an encapsulant formed on the first packaging element and covering the first antenna.

4. The packaging structure of claim 3, wherein the encapsulant is further formed on the electromagnetic interference shield metal layer that is formed on the second packaging element.

5. The packaging structure of claim 3, further comprising at least a conductive hole formed in the encapsulant and having a first end connected to the first antenna and a second end exposed from the encapsulant.

6. The packaging structure of claim 5, further comprising a second antenna disposed on the encapsulant and connected to the second end of the conductive hole.

7. The packaging structure of claim 5, further comprising at least a second conductive hole formed in the encapsulant.

8. A packaging structure, comprising:
   a substrate;
   a first packaging element disposed on the substrate;
   a second packaging element disposed on the substrate and spaced apart from the first packaging element;
   an electromagnetic interference shield metal layer formed on the first packaging element and the second packaging element, wherein the first packaging element is free from being correspondingly formed with an electromagnetic interference shield structure thereon;
   an encapsulant formed on a first portion of the electromagnetic interference shield metal layer formed on the first packaging element;
   at least a conductive hole formed in the encapsulant and having an end exposed from the encapsulant; and
   an antenna formed on the encapsulant and connected to the end of the conductive hole, wherein the second packaging element is free from being correspondingly formed with an antenna structure thereon.

9. The packaging structure of claim 8, wherein the first packaging element or the second packaging element further comprises at least one electronic element.

10. The packaging structure of claim 8, wherein the encapsulant is further formed on the electromagnetic interference shield metal layer that is formed on the second packaging element.

11. The packaging structure of claim 8, further comprising at least a second conductive hole formed in the encapsulant.

12. A method, comprising:
    providing a package having a substrate, a first packaging element disposed on the substrate, and a second packaging element disposed on the substrate and spaced apart from the first packaging element;
    forming a metal layer on the first packaging element and the second packaging element, wherein the metal layer on the second packaging element is an electromagnetic interference shield metal layer, and the second packaging element is free from being correspondingly formed with an antenna structure thereon; and
    patterning a first portion of the metal layer that is formed on the first packaging element to form a first antenna on the first packaging element, wherein the first packaging element is free from being correspondingly formed with an electromagnetic interference shield structure thereon.

13. The method of claim 12, further comprising forming on the first packaging element an encapsulant that encapsulates the first antenna.

14. The method of claim 13, wherein the encapsulant is further formed on a second portion of the metal layer that is formed on the second packaging element.

15. The method of claim 13, further comprising forming in the encapsulant at least a conductive hole that has a first end connected to the first antenna and a second end exposed from the encapsulant.

16. The method of claim 15, further comprising forming at least a second conductive hole in the encapsulant.

17. The method of claim 16, further comprising disposing on the encapsulant a second antenna that is connected to the second end of the conductive hole.

18. The method of claim 12, wherein the first antenna is formed by a laser engraving, electroplating or etching process.

19. A method, comprising:
    providing a package having a substrate, a first packaging element disposed on the substrate, and a second packaging element disposed on the substrate and spaced apart from the first packaging element;
    forming a metal layer on the first packaging element and the second packaging element, wherein the metal layer on the second packaging element is an electromagnetic interference shield metal layer, and the second packaging element is free from being correspondingly formed with an antenna structure thereon;
    forming an encapsulant on a first portion of the metal layer that is formed on the first packaging element;
    forming in the encapsulant at least a conductive hole that has a first end connected to the first portion of the metal layer and a second end exposed from the encapsulant; and forming on the encapsulant an antenna that is connected to the second end of the conductive hole, wherein the first packaging element is free from being correspondingly formed with an electromagnetic interference shield structure thereon.

20. The method of claim 19, wherein the encapsulant is further formed on a second portion of the metal layer that is formed on the second packaging element.

21. The method of claim 19, further comprising forming at least a second conductive hole in the encapsulant.

22. The method of claim 19, wherein the antenna is formed by a laser engraving, electroplating or etching process.

* * * * *